United States Patent [19]

Doyle, III

[11] Patent Number: 4,710,730

[45] Date of Patent: Dec. 1, 1987

[54] DATA CLOCK OSCILLATOR HAVING ACCURATE DUTY CYCLE

[75] Inventor: Joseph E. Doyle, III, Chicago, Ill.

[73] Assignee: Motorola, Inc., Schaumburg, Ill.

[21] Appl. No.: 28,287

[22] Filed: Mar. 20, 1987

[51] Int. Cl.$^4$ .............................................. H03B 5/32
[52] U.S. Cl. .............................. 331/116 FE; 331/160
[58] Field of Search ............... 331/108 D, 109, 116 R, 331/116 FE, 158, 160

[56] References Cited

U.S. PATENT DOCUMENTS

| | | | |
|---|---|---|---|
| 4,065,728 | 12/1977 | Saari | 331/75 |
| 4,110,704 | 8/1978 | Irwin et al. | 331/113 R |
| 4,211,985 | 7/1980 | Yamashiro | 331/116 |
| 4,376,918 | 3/1983 | Masuda et al. | 331/116 FE |
| 4,387,349 | 6/1983 | Rapp | 331/116 FE |
| 4,405,906 | 9/1983 | Luscher | 331/116 FE |
| 4,459,565 | 7/1984 | Leach | 331/116 FE |
| 4,587,497 | 5/1986 | Keller et al. | 331/116 R |

OTHER PUBLICATIONS

Allen, P. E., and Sanches-Siencio, E., Switched Capacitor Circuits, (New York: Van Nostrand Reinhold Company Limited, Electrical/Computer Science and Engineering Series, 1984) pp. 611-613.

Embree, D. M., et al., "Miniature Packaged Crystal Oscillators", Proc. 34th Ann. Freq. Control Symposium, USAERADCOM, Ft. Monmouth, NJ 07703, May 1980, pp. 475-487.

Matthys, R. J., Crystal Oscillator Circuits, (New York: John Wiley & Sons, 1983), pp. 151-152.

Santos, J. T. and Meyer, R. G., "A One-Pin Crystal Oscillator for VLSI Circuits", IEEE Journal of Solid-State Circuits, vol. SC-19, No. 2, Apr. 1984, pp. 228-235.

*Primary Examiner*—Eugene R. Laroche
*Assistant Examiner*—Robert J. Pascal
*Attorney, Agent, or Firm*—Douglas A. Boehm; Donald B. Southard; Charles L. Warren

[57] ABSTRACT

A CMOS data clock oscillator circuit is disclosed which provides a simple, inexpensive, high-specification oscillator with an accurate duty cycle. The data clock oscillator 100 includes an oscillator stage 121 providing an AC output signal having an average DC value determined by an applied bias voltage, a limiting stage 124 having MOSFETs 102 and 103 configured to form a back-to-back limiter network to limit the amplitude of the AC output signal, a CMOS biasing stage 122 including complementary MOSFETs 104 and 105 configured to form an active resistor voltage divider network providing the bias voltage for the oscillator stage, and a CMOS buffer stage 123 including complementary MOSFETs 106 and 107 configured to form an inverting amplifier network having a predefined input switching threshold. Buffer stage MOSFETs 106 and 107 have conduction types, geometries, and device parameters matched to those of bias stage MOSFETs 104 and 105, respectively. In this way the inverter network input switching threshold tracks the bias voltage over changes in temperature, supply voltage, and manufacturing process tolerances. The instant invention is particularly well adapted for use as a data clock oscillator in microprocessor applications.

20 Claims, 5 Drawing Figures

DATA CLOCK OSCILLATOR HAVING ACCURATE DUTY CYCLE

BACKGROUND OF THE INVENTION

The present invention relates generally to the field of oscillators, and, in particular, to improvements in crystal-controlled CMOS data clock oscillators which must meet stringent square wave output specifications.

Modern semiconductor technology has made possible the development and production of highly stable reference oscillators for a wide variety of electronic equipment. Data clock oscillators, utilizing complementary metal-oxide-semiconductor (CMOS) technology, have been widely used in various timing applications over the frequency range of 0.5 MHz to 30 MHz. The stringent electrical specifications for such data clock oscillators include: operation over a wide temperature range ($-40°$ C. to $+85°$ C.); high frequency stabilities ($+/-100$ parts per million); low power consumption (100 milliwatts); supply voltage operating range (4.5 to 5.5 VDC); and precise duty cycle control.

Although many data clock oscillator applications only require a nominal 40%-60% duty cycle, several computer or communications-based IC designs now require a more precise duty cycle within at least a 45%-55% tolerance. Such a requirement is specified for the Motorola MC68000 series microprocessors. Furthermore, certain microprocessor applications require even tighter specifications, such as 50% $+/-3\%$ symmetry.

Several alternatives exist to achieve precise duty cycle control. It is well known that a perfectly symmetrical duty cycle can be achieved by operating the oscillator at some multiple of the desired output frequency, and then dividing the oscillator output signal by means of a digital divider circuit. Hence, in integrated circuit designs, the oscillators often run at twice the required frequency, and the output is then fed to a flip-flop to achieve an accurate 50% duty cycle. However, this divider approach limits the upper frequency boundary that can be achieved with a crystal resonator operating in the fundamental mode. The additional divider circuitry also significantly increases the cost and complexity of the oscillator—solely to achieve an accurate duty cycle.

A second approach for achieving a more accurate duty cycle output is the addition of an automatic gain control (AGC) circuit with a sine-to-square wave conversion circuit. The AGC would compensate for variations in supply voltage $V_{CC}$, temperature variations, and integrated circuit processing variations, and the low-level output signal would then be converted to the required square wave. An AGC circuit, however, tends to degrade the signal-to-noise (S/N) performance of the oscillator, since the AGC requires small signal amplitudes to operate. This degradation is in addition to the obvious cost and complexity disadvantages of additional AGC circuitry.

The prior art also teaches that the use of complementary-type transistors, i.e., PNP/NPN or P-channel/N-channel, between the power supply voltage $V_{CC}$ and ground voltage $V_{SS}$, improves the output waveform symmetry. Moreover, it is also known that the threshold voltages $V_T$ of MOS transistors, which are part of one and the same integrated circuit, tend to track each other over temperature and process variations. Hence, using a combination of these approaches, the waveform symmetry then becomes dependent upon the tracking characteristics of the output CMOS stage. Although presently available CMOS data clock oscillators can surpass the minimal specifications of frequency tolerance, temperature stability, and supply voltage rejection, unfortunately, they often fail to meet the stringent duty cycle requirement of 50% $+/-5\%$.

A need, therefore, exists for a simple, cost-effective, data clock oscillator which exhibits accurate output symmetry over variations in frequency, temperature, supply voltage, and processing.

SUMMARY OF THE INVENTION

Accordingly, it is an object of the present invention to provide an improved and simplified data clock oscillator which overcomes the aforementioned deficiencies.

A more particular object of the present invention is to provide an improved CMOS data clock oscillator circuit for applications having precise duty cycle requirements.

It is a further object of the present invention to provide an improved data clock oscillator circuit having reduced circuit complexity and decreased manufacturing costs.

Briefly stated, the present invention provides an improved CMOS data clock oscillator circuit comprising: an oscillator stage including a piezoelectric crystal, a plurality of reactive elements, and a first MOSFET, configured to form a Colpitts oscillator providing an AC output signal having an average DC value determined by an applied bias voltage; a limiting stage including second and third MOSFETs configured to form a back-to-back limiter network providing a soft clipping action to limit the amplitude of the AC output signal such that it remains within the operational supply voltage range; a CMOS biasing stage including fourth and fifth complementary MOSFETs configured to form an active resistor voltage divider network providing a bias voltage applied to the oscillator stage; a CMOS buffer stage, coupled to the oscillator stage output, including sixth and seventh complementary MOSFETs configured to form an inverting amplifier network providing a square wave output signal, the inverting amplifier network having a predefined input switching threshold, the sixth and seventh MOSFETs having conduction types, geometries, and device parameters matched to those of the fourth and fifth MOSFETs, respectively, such that the inverter network input switching threshold tracks the bias voltage over changes in temperature, supply voltage, and manufacturing process tolerances.

The resultant oscillator configuration exhibits excellent output waveform symmetry, since the active resistor bias stage is matched to the output buffer stage to allow the bias voltage to track any movement in the buffer switching threshold. The limiter stage prevents a high amplitude oscillator stage output signal from approaching the power supply rails, which could distort duty cycle. In the preferred embodiment, one of the bias MOSFETs is given a different geometry to slightly offset the bias voltage from the switching threshold so as to prevent output triggering on random noise while still maintaining a precise duty cycle.

BRIEF DESCRIPTION OF THE DRAWINGS

The features of the present invention which are believed to be novel are set forth with particularity in he appended claims. The invention, together with further objects and advantages thereof, may best be understood by reference to the following description taken in connection with the accompanying drawings, in the several figures of which like-referenced numerals identify like elements, and in which:

DETAILED DESCRIPTION OF THE PREFERRED EMBODIMENT

Figure 1:
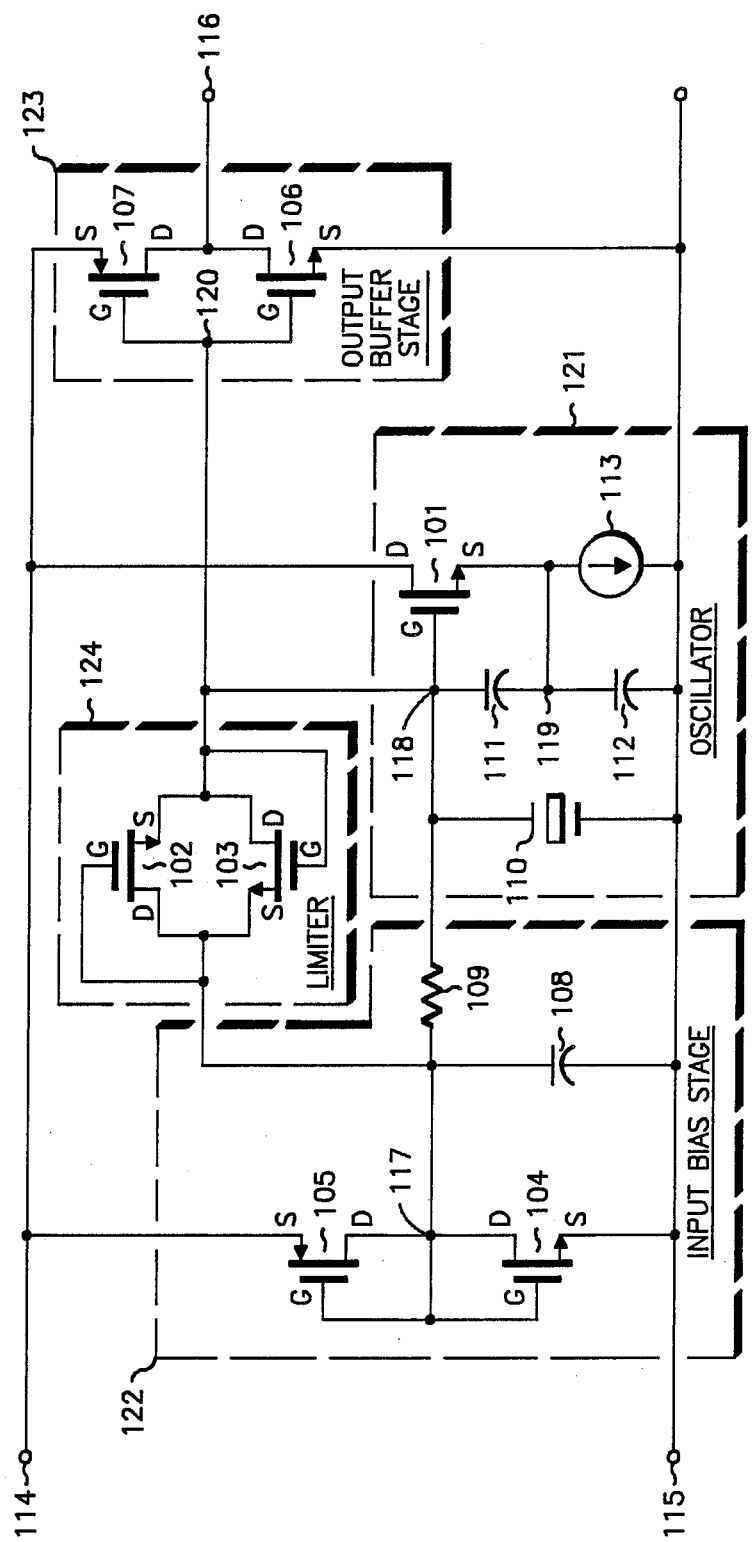
FIG. 1 is a schematic circuit diagram of the improved data clock oscillator according to the present invention.

The preferred embodiment of the invention, illustrated in FIG. 1, is data clock oscillator 100 implemented in a CMOS integrated circuit (IC). For purposes of understanding the invention, FIG. 1 has been divided into four functional blocks: (1) oscillator stage 121; (2) input bias stage 122; (3) output buffer stage 123; and (4) limiter stage 124.

Oscillator stage 121 performs the frequency generation function, and in the preferred embodiment, is configured as a Colpitts-type oscillator. However, for different applications, oscillator stage 121 may be configured as a Pierce, Clapp, or other type of oscillator configuration. Moreover, oscillator 121 may include additional circuitry for temperature compensation, frequency adjustment, or frequency modulation, if desired.

Input bias stage 122 performs the function of providing a DC bias voltage for oscillator 121. The transistors in the input bias stage are configured as a voltage divider utilizing the "active resistor" type of configuration, which will be described in detail below. The matching characteristics of the active devices and their device tracking capabilities allow the present invention to achieve a precise duty cycle.

Output buffer stage 123 provides the signal amplification and/or output squaring functions as well as a load isolation function for the oscillator circuit. A buffer amplifier stage is often attached to an oscillator circuit to amplify the oscillator signal (voltage or current amplification) or to match the oscillator output to various load conditions. However, the particular matching characteristics and circuit configuration described below allow the present invention to provide accurate output symmetry without elaborate AGC or divider circuitry.

An important feature of the present invention is that the input bias stage is constructed to track the output buffer stage over temperature, voltage, and processing. This requirement may readily be achieved utilizing CMOS integrated circuits by matching the geometries of input device 105 to output device 107, and matching input device 104 to output device 106. As used herein, the term matching two devices refers to utilizing the same conduction type of device and constructing their respective geometries such that the two devices have the closest electrical characteristics that can be readily achieved for the type of device.

For example, in MOS integrated circuits, transistor 105 would be matched to transistor 107 if the two devices were both either NMOS or PMOS, and if their respective channel width dimension W and channel length dimension L were constructed to be substantially identical. Furthermore, the two devices can be made to track more closely over temperature and processing variations if the two devices were located next to each other on the same integrated circuit substrate. The difference in threshold voltage $V_T$ between two CMOS is very sensitive to placement location on the integrated circuit.

Limiter 124 serves to prevent the oscillator output amplitude from reaching supply voltage $V_{CC}$ at 114 or ground voltage $V_{SS}$ at 115. Without the limiter, the oscillator output signal could swing above supply or below ground such that a change in the average DC voltage of the output signal could effect the duty cycle. This limiting action will be more fully described below.

In the preferred embodiment, oscillator 121 is configured as a Colpitts-type oscillator implemented using N-channel MOSFET (MOS field effect transistor) 101, having gate G, drain D, and source S terminals as shown in FIG. 1. Transistor 101 of the oscillator may alternatively be a bipolar transistor as might be implemented in a bi-MOS process. Device 101 is selected to give the proper transconductance ($g_m$) to sustain oscillation at the highest frequency of interest.

The DC bias for the gate terminal is provided by input bias stage 122 at node 118. The gate of transistor 101 also serves as the oscillator output node, which supplies the oscillator AC output signal to output buffer stage 123, as well as being connected to the resonator tank circuit. The crystal oscillator tank circuit is comprised of the series combination of capacitor 111, capacitor 112, and quartz crystal 110. Capacitor 111 is connected between node 118 and 119, which represent the gate and source terminals of transistor 101, respectively. Capacitor 112 is connected between the transistor source terminal at 119 and the negative supply voltage $V_{SS}$ terminal 115. Quartz crystal 110 is connected as shown between the gate node 118, and $V_{SS}$ terminal 115.

In the preferred embodiment, crystal 110 is an AT-cut strip resonator operating in the thickness-shear mode of vibration, and in the fundamental mode of oscillation, at a frequency between 10 and 20 MHz. It is contemplated, however, that other crystal cuts, types, and modes of vibration may also be used. However, it has been found that a third overtone crystal is undesirable due to the added cost and unreliability of the additional circuitry needed to suppress the fundamental mode. Furthermore, the present invention may be used with a crystal operating at any frequency, but with the instant circuit configuration, there is no need to run the crystal at twice the output frequency with an output divider circuit.

Constant current source 113, connected between the source of transistor 101 and $V_{SS}$, serves to regulate the drain-to-source current of transistor 101. Constant current source 113 may be replaced by a simple resistor, a standard transistor current source network, or the CMOS current source which temperature compensates the oscillator gain, as subsequently described in FIG. 3.

Input bias stage 122 is comprised of P-channel MOSFET 105 and N-channel MOSFET 104 in an "active resistor divider" configuration. As can be seen in FIG. 1, the source of P-channel device 105 is connected to $V_{CC}$ at 114, while its gate and drain terminals are coupled to the gate and drain terminals of the N-channel device 104 at node 117. The source terminal of transistor 104 is connected to $V_{SS}$. In this active resistor configuration, the voltage at node 117 is dependent on the ratio of the device geometries of transistors 104 and 105, which are nominally selected for a voltage of $V_{CC}/2$.

Capacitor 108 is also coupled from node 117 to $V_{SS}$. Capacitor 108 serves two purposes. First, capacitor 108 serves as a low-pass filter to power supply noise utilizing the "on resistance" of MOS device 105. Secondly, capacitor 108 functions as an AC short circuit for limiter stage 124, described below.

Resistor 109 couples the low impedance bias voltage at node 117 to the high impedance oscillator input node 118, and hence, should be of a reasonably high value. The value of resistor 109 must be at least 20 kilohms, such that it does not degrade the high Q of the resonant tank circuit. In the preferred embodiment, resistor 109 is implemented as an N-well resistor having a value of 60 kilohms.

Resistor 109 and capacitor 108 are not necessarily required to make the input bias stage function correctly. However, if the limiter stage is used, a low impedance point at the input to the limiter is necessary, which is accomplished by capacitor 108. Resistor 109 is then required to transform this low impedance to the high impedance bias voltage output.

Output buffer stage 123 is comprised of CMOS devices 107 and 106. Transistor 107 has its source coupled to $V_{CC}$ at 114, its gate connected to input node 120, and its drain connected to output node 116. Similarly, transistor 106 has its source connected to $V_{SS}$ at 115, its gate connected to input node 120, and its drain connected to output node 116. In this complementary output configuration, the linear oscillator output signal at 118 is connected to the buffer stage input node 120, and is then amplified to a square wave output signal at node 116. In the preferred embodiment, the CMOS output stage buffer is configured as an inverter.

To obtain a symmetrical duty cycle, the input switching threshold of buffer stage 123 at node 120 must be set to precisely equal the average DC value of the oscillator AC output signal available at node 118. Furthermore, these points must remain equal over changes in temperature, power supply voltage variations, and subsequent data clock oscillator MOSFET manufacturing process tolerances. The present invention accomplishes this goal by designing input bias stage 122 to provide a bias voltage $V_{BB}$ at node 118 which tracks the buffer stage input switching threshold voltage $V_{TRIG}$ at node 120 over temperature, process, and power supply variations.

To accomplish this result, the P-and N-channel $\beta$'s and threshold voltages must be matched. The gain parameter $\beta$ (Beta) of a MOS device is a function of process parameters and the geometric size of the device. It is given by the expression:

$$\beta = K' \times W/L$$

where K' is the intrinsic transconductance of the device (a process parameter), which is itself the product of the carrier mobility $\mu$ and the gate capacitance per unit area $C_o$, W is the geometric channel width, and L is the geometric channel length. The device threshold voltage $V_T$ is a function of process parameters (e.g., oxide thickness) and is affected by the geometry of the device (i.e., channel length L). To achieve optimum matching between devices, the following rules must be adhered to:

1. The devices should be of the same conduction type, or structure (i.e., P-channel devices are matched to P-channel devices and N-channel devices are matched to N-channel devices).
2. The devices should remain at the same temperature (including approximately the same power dissipation).
3. The devices should have the same shape (circular or rectangular) and the same size (channel width and length dimensions).
4. The devices should have a minimum separation in layout (to avoid process parameter gradients such as oxide thickness).
5. The devices should have the same orientation on the IC (i.e., parallel drain-to-source current flow).
6. The devices should not be minimum size (e.g., 4 micron versus the minimum 3 micron dimension) to avoid short-channel effects.

If the above rules are followed, a threshold voltage mismatch and $\beta$ mismatch can be held to less than 5%.

Limiter 124 is comprised of two N-channel MOSFET devices 102 and 103 connected in a "back-to-back" limiter configuration. The drain of transistor 102 is connected to its gate as well as to the source of transistor 103, and serves as the limiter reference point. The source of transistor 102 is connected to the drain and gate terminals of transistor 103, and serve as the limiter input terminal. As mentioned above, limiter 124 clips the amplitude of the oscillator output signal such that there will be a symmetrical swing about an average DC voltage without clamping to $V_{CC}$ or $V_{SS}$. An alternate configuration for limiter 124 will subsequently be described in FIG. 5.

The W/L dimensions of devices 102 and 103 are selected to provide a "soft" limiting action to facilitate a high circuit Q. In the preferred embodiment, these device sizes were selected to yield a 3.3 $V_{P-P}$ signal at node 118, resulting in a high S/N ratio. The limiting function requires that there be a short circuit to $V_{SS}$ at the limiter reference node 117. This short is provided by capacitor 108. The value of capacitor 108 is selected to be an AC short at the lowest frequency of interest.

The use of limiter 124 permits oscillator operation at high signal amplitudes, thus improving the signal-to-noise ratio over AGC-based designs. For example, the preferred embodiment limits at approximately 3.3 $V_{P-P}$, which is approximately a 15 dB improvement over the equivalent AGC design. The back-to-back configured device pair limits the amplitude of the oscillator signal to approximately $+/-V_{GS}$. The gate-to-source voltage is a function of geometry and threshold voltage, and is given by the equation:

$$V_{GS} = \sqrt{[2 I_D/\beta]} + V_T$$

wherein $I_D$ is the drain current during limiting.

Figure 2:
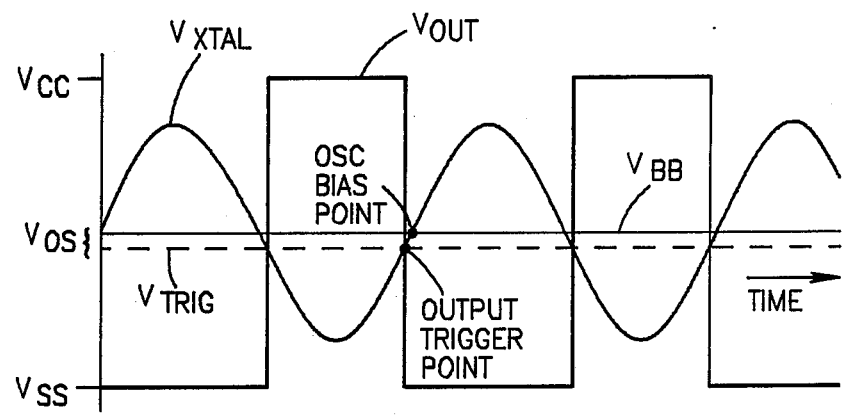
FIG. 2 is a graphic representation of the crystal oscillator stage output voltage and the buffer stage output voltage versus time for the data clock oscillator circuit of FIG. 1.

Referring now to FIG. 2, the crystal output waveform $V_{XTAL}$ at node 118 is shown overlaying the output squarewave $V_{OUT}$ at node 116. Since the output buffer stage is an inverter circuit in the preferred embodiment, $V_{OUT}$ approaches $V_{CC}$ when $V_{XTAL}$ approaches $V_{SS}$. According to the teaching of the present invention, the oscillator bias point $V_{BB}$, which is determined by the active resistor network of the input bias stage, must track changes in the output buffer stage trigger threshold $V_{TRIG}$. More specifically, utilizing CMOS devices, the geometry of input device 105 must match that of output device 107, and, similarly, the geometry of input device 104 must match that of output device 106. In this manner, the bias voltage $V_{BB}$ and the switching voltage $V_{TRIG}$ linearly track over variations in processing, temperature, frequency, and voltage, such that a highly symmetrical output signal is provided.

A further feature of the present invention is that the bias voltage $V_{BB}$ can be set at some value that is higher or lower, by some offset voltage $V_{OS}$, than the switching threshold $V_{TRIG}$ of the output buffer stage. This offset feature prevents uncontrolled oscillation. Although the introduction of offset voltage $V_{OS}$ affects the duty cycle, if the offset is chosen to be small enough (less than 0.1 VDC), then the output symmetry will be within the 50% +/−5% symmetry specification.

This offset feature is illustrated in FIG. 2 by noting that $V_{XTAL}$ has an average DC value equal to the bias voltage $V_{BB}$. However, the output buffer stage voltage switching threshold $V_{TRIG}$ at node 120 is illustrated to be below $V_{BB}$ by some offset value $V_{OS}$. Hence, the zero-crossing point of the oscillator stage output waveform $V_{XTAL}$ occurs at a slightly different point in time from the output waveform $V_{OUT}$ zero-crossing point.

In the preferred embodiment, the output buffer stage devices 106 and 107 are matched to the input bias stage devices 104 and 105, respectively, with a slight offset to avoid the output switching on noise or when no crystal is present. If this offset feature is used, the duty cycle at the output will be slightly different than 50% for a pure sign wave at the input node 120. The duty cycle will then be given by the equation:

$$Duty\ Cycle = 100\% \times [180° - 2\sin^{-1}(V_{OS}/V_p)]/360°$$

where $V_{OS}$ is the offset voltage between $V_{BB}$ and $V_{TRIG}$.

As noted above, the use of the offset voltage $V_{OS}$ means that the output waveform no longer has an exact 50% duty cycle. Note also that the amplitude of the oscillator output signal $V_{XTAL}$ has an effect on the duty cycle. For example, in FIG. 2, the duty cycle is decreased as the amplitude of the oscillator signal $V_{XTAL}$ is lowered. Hence, the greater oscillator output signal has a better duty cycle. In the preferred embodiment, the amplitude of $V_{XTAL}$ is limited to approximately 3.3 $V_{P-P}$ centered around $V_{BB}$ at 2.5 VDC, and the offset voltage $V_{OS}$ is approximately 0.08 VDC in the direction toward $V_{SS}$. This is accomplished by making the channel width of MOSFET device 104 slightly smaller than the corresponding channel width of MOSFET device 106. This produces a waveform having a duty cycle of approximately 49% as illustrated in FIG. 2.

Figure 3:
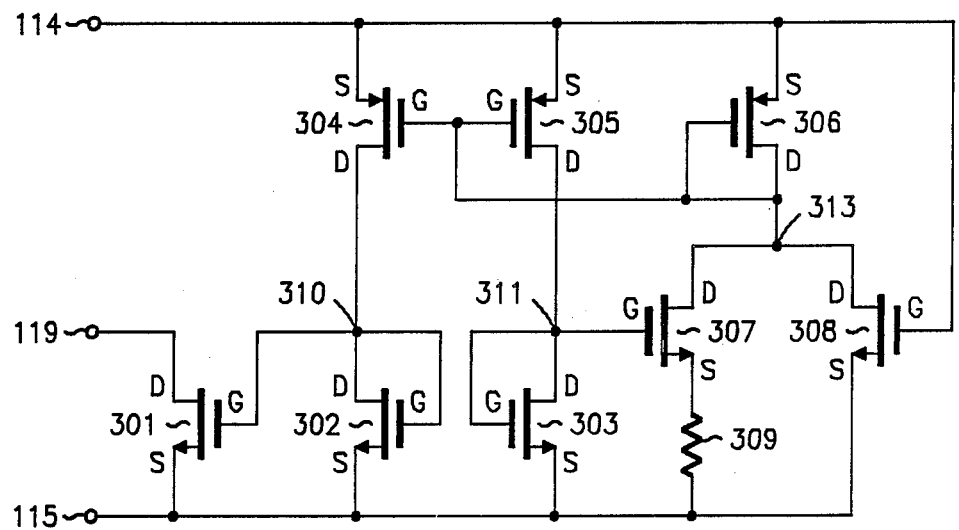
FIG. 3 is a schematic diagram of the preferred embodiment of the constant current source 113 of FIG. 1.

FIG. 3 illustrates current source 300 that can be substituted as current source 113 of FIG. 1. Note that 114 is supply node $V_{CC}$, node 115 is ground $V_{SS}$, and node 119 is the source terminal of oscillator transistor 101. The current source shown, used in the preferred embodiment, is stabilized for supply voltage $V_{CC}$ variations, and also compensates the oscillator gain over temperature changes. MOSFETs 303 and 307 generate a voltage across resistor 309 which increases with temperature, and compensates for the positive temperature coefficient of resistor 309. The net result is drain current which increases with temperature. MOSFETs 301, 302, and 304 through 306, complete the current mirror.

In the preferred embodiment, current source 113 is comprised of eight MOSFETs and a resistor, which provides a 2 milliamp drain-to-source current for transistor 101. However, if the constant current source aspect of the oscillator is not required, source 113 may simply be replaced by a resistor. Furthermore, a constant current source without temperature compensation may be used in particular applications.

Figure 4:
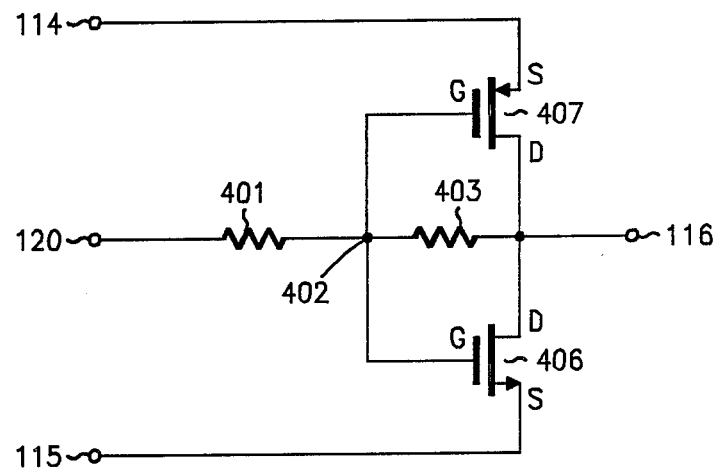
FIG. 4 is a schematic diagram of an alternate embodiment of the output buffer stage 123 of FIG. 1.

FIG. 4 illustrates an alternate embodiment of buffer stage 123. If a squarewave output is not desired, output buffer stage 400 may be used to provide a sine wave output. CMOS devices 406 and 407 are similar in construction and operation to transistors 106 and 107, respectively. Resistor 401 is selected such that the output buffer doesn't load down the high impedance oscillator output. The ratio of feedback resistor 403 to input resistor 401 determines the gain of output stage 400.

Figure 5:
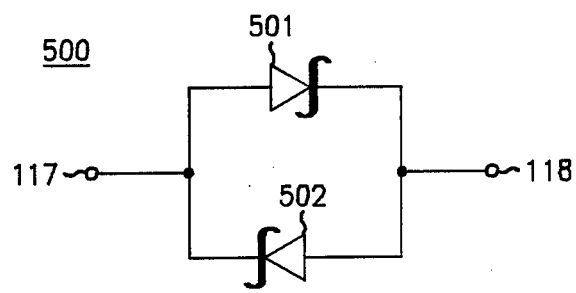
FIG. 5 is a schematic diagram of an alternate embodiment of the limiter network 124 of FIG. 1.

FIG. 5 represents an alternate embodiment of limiter stage 124. Limiter 500, connected between low impedance node 117 and oscillator output node 118, is configured as "back-to-back" Schottky diodes. Diodes 501 and 502 conduct on alternate cycles of the waveform to clip the AC output signal before it reaches $V_{CC}$ or $V_{SS}$.

In the preferred embodiment, oscillator 100 is implemented in an N-well CMOS process having a 3.0 micron minimum channel length. The dimensions of the MOSFET devices are shown below. The actual device sizes are made 20% smaller (i.e., 20% shrink) during the mask-making operation.

A representative set of circuit values for crystal oscillator circuit 100 are listed below:

| | |
|---|---|
| Supply voltage $V_{CC}$ | +5.0 VDC |
| Ground voltage $V_{SS}$ | 0 VDC |
| N-channel MOSFET 101 | 2480/3 |
| N-channel MOSFET 102 | 260/3 |
| N-channel MOSFET 103 | 260/3 |
| N-channel MOSFET 104 | 22/4 |
| P-channel MOSFET 105 | 66/4 |
| N-channel MOSFET 106 | 27/4 |
| P-channel MOSFET 107 | 66/4 |
| Capacitor 108 | 34 pF |
| Capacitor 111 | 28 pF |
| Capacitor 112 | 82 pF |
| Resistor 109 | 60 Kohms |
| Crystal 110 | |
| (Frequency) | 10–20 MHz |
| (Resistance) | Max. 60 ohms (typ. 10 ohms) |

In the preferred embodiment, the capacitors are integrated MOS (double layer poly-silicon) for cost and size advantages. However, if desired, the capacitors could be external to the IC. The concept of the present invention may readily be extended to higher frequencies by reducing the channel lengths of the MOS devices, e.g., L=1 micron. Furthermore, higher oscillator frequencies can be readily obtained by decreasing the value of capacitor 112.

In review, the present invention provides a data clock oscillator circuit with input bias stage/output buffer stage tracking capability and oscillator output signal limiting, such that the combination of these features provide an output waveform having an accurate duty cycle in a cost effective manner. Further advantages include: low process dependency; inherent circuit simplicity; wide temperature operating range; low supply voltage dependency; wide supply voltage operating range; minimum space requirements; high signal-to-noise ratio; and frequency independent.

Although a specific embodiment of the present invention has been shown and described herein, further modifications and improvements may be made by those skilled in the art. For example, it is contemplated that the circuit configuration of the present invention may be implemented using discrete devices, as long as the indicated transistors are matched. It is further contemplated that a similar circuit configuration to that of the present invention may be achieved using inverted topology, i.e., opposite conduction type devices. All such modifications which retain the basic underlying principles disclosed and claimed herein are within the scope of this invention.

What is claimed is:

1. A crystal oscillator comprising:
oscillator means for generating an AC output signal, said oscillator means including tank circuit means for resonating at a predetermined operating frequency, and including feedback amplifier means for providing regenerative feedback to said tank circuit means to sustain oscillation, said oscillator means further including input means for accepting a bias signal and output means for providing said AC output signal having a first duty cycle and having an average DC value determined by said bias signal;
buffer means for amplifying said AC output signal, said buffer means including input means, coupled to said oscillator output means, for accepting said AC output signal, said buffer input means having a predefined switching threshold, said buffer means further including output means for providing a crystal oscillator output signal having a second duty cycle determined by said first duty cycle, said AC output signal average DC value, and said predefined switching threshold;
biasing means, coupled to said oscillator input means, for providing said bias signal, said biasing means adapted to track device parameter variations of said buffer means and adapted to vary said bias signal such that said average DC value of said AC output signal follows said predefined switching threshold over changes in temperature, supply voltage, and manufacturing processes, thereby providing a crystal oscillator output signal exhibiting a precise duty cycle.

2. The crystal oscillator according to claim 1, further comprising means, coupled to said oscillator means, for limiting the amplitude of said AC output signal such that said amplitude remains within predefined limits within the operational supply voltage range of said crystal oscillator.

3. The crystal oscillator according to claim 1, wherein said buffer means is comprised of at least one pair of complimentary MOSFETs constructed and arranged to form an inverting amplifier network.

4. The crystal oscillator according to claim 3, wherein said biasing means is comprised of at least one pair of complimentary MOSFETs constructed and arranged to form an active resistor voltage divider network.

5. The crystal oscillator according to claim 2, wherein said means for limiting is comprised of at least one pair of MOSFETs constructed and arranged to form a back-to-back limiter network.

6. The crystal oscillator according to claim 4, wherein said device parameters include MOSFET threshold voltage and gain.

7. The crystal oscillator according to claim 4, wherein at least one MOSFET of said complimentary pair from said biasing means and at least one MOSFET of said complementary pair from said buffer means have matched geometries and conduction types.

8. The crystal oscillator according to claim 1, wherein said average DC value of said AC output signal is offset from said predefined switching threshold to prevent switching on random noise.

9. A crystal oscillator, having improved duty cycle accuracy, comprising:
an oscillator stage including an input bias node, an output signal node, a piezoelectric crystal, a plurality of reactive elements, and at least a first transistor, constructed and arranged to form a parallel resonant oscillator providing an AC output signal at said output node having an average DC value determined by the voltage applied to said input bias node;
a biasing stage including second and third transistors constructed and arranged to form a voltage divider network providing a bias voltage at an output divider node coupled to said oscillator input bias node, said second and third transistors having predefined device parameters;
a buffer stage including forth and fifth transistors constructed and arranged to form an amplifier network providing a crystal oscillator output signal at an amplifier output node, said amplifier network having a predefined input switching threshold at an amplifier input node, coupled to said oscillator output signal node, said forth and fifth transistors having device parameters matched to those of said second and third transistors, respectively, such that said amplifier network input switching threshold tracks said bias voltage over changes in temperature, supply voltage, and crystal oscillator manufacturing tolerances, thereby providing a crystal oscillator output signal exhibiting a precise duty cycle.

10. The crystal oscillator according to claim 9, wherein said second and third transistors are constructed and arranged as a first complimentary pair, and said forth and fifth transistors are constructed and arranged as a second complimentary pair.

11. The crystal oscillator according to claim 10, wherein said second and fourth transistors operate at a greater power supply voltage than said third and fifth transistors, respectively.

12. The crystal oscillator according to claim 11, wherein said second and third transistors have conduction types and geometries matched to said fourth and fifth transistors, respectively.

13. The crystal oscillator according to claim 11, wherein one transistor of said first complimentary pair is slightly mismatched to its corresponding transistor of said second complimentary pair to provide a slight offset voltage between said amplifier network input switching threshold and said bias voltage.

14. The crystal oscillator according to claim 9, further comprising a limiter stage, coupled to said oscillator stage, constructed and arranged to limit the amplitude of said AC output signal such that said amplitude remains within predefined limits within the operational supply voltage range of said crystal oscillator.

15. The crystal oscillator according to claim 9, wherein said second, third, fourth and fifth transistors are MOSFETs constructed and arranged in the same integrated circuit.

16. A CMOS data clock oscillator, having improved duty cycle accuracy, comprising:
an oscillator stage including an input bias node, an output signal node, a piezoelectric crystal, a plurality of reactive elements, and a first MOSFET, constructed and arranged to form a Colpitts oscillator providing an AC output signal at said output node having an average DC value determined by the voltage applied to said input bias node;
a limiting stage, coupled to said oscillator stage, including second and third MOSFETs constructed and arranged to form a back-to-back limiter network providing a soft clipping action to limit the amplitude of said AC output signal such that said amplitude remains within a predefined range within the operational supply voltage range of said data clock oscillator;
a CMOS biasing stage including fourth and fifth complementary MOSFETs constructed and arranged to form an active resistor voltage divider network providing a bias voltage at an output divider node coupled to said oscillator input bias node, said fourth MOSFET operating at a greater power supply voltage than said fifth MOSFET, said fourth and fifth MOSFETs having predefined geometries and device parameters;
a CMOS buffer stage including sixth and seventh complementary MOSFETs constructed and arranged to form an inverting amplifier network providing a square wave output signal at an inverter output node, said inverting amplifier network having a predefined input switching threshold at an inverter input node, coupled to said oscillator output signal node, said sixth MOSFET operating at a greater power supply voltage than said seventh MOSFET, said sixth and seventh MOSFETs having conduction types, geometries, and device parameters closely matched to those of said fourth and fifth MOSFETs, respectively, such that said inverter network input switching threshold tracks said bias voltage over changes in temperature, supply voltage, and subsequent data clock oscillator MOSFET manufacturing process tolerances, thereby providing a data clock oscillator having an output signal exhibiting a precise duty cycle.

17. The CMOS data clock oscillator according to claim 16, wherein said fourth and sixth MOSFETs are P-channel, wherein said fifth and seventh MOSFETs are N-channel, and wherein said second and third MOSFETs are both N-channel.

18. The CMOS data clock oscillator according to claim 16, wherein said geometries include MOSFET channel width and channel length dimensions, and wherein said device parameters include device gain and threshold voltage.

19. The CMOS data clock oscillator according to claim 16, wherein said fourth and fifth MOSFETs of said active resistor voltage divider network have their respective drain and gate terminals coupled to a common node, and their source terminals coupled to supply and ground voltages, respectively.

20. The CMOS data clock oscillator according to claim 19, wherein said CMOS biasing stage further includes a capacitor and a resistor coupled to said common node to provide filtering and impedance transformation at said output divider node.

* * * * *